(12) United States Patent
Xi et al.

(10) Patent No.: US 11,955,569 B2
(45) Date of Patent: Apr. 9, 2024

(54) PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Zhixiang Xi, Zhejiang (CN); Juan Wang, Zhejiang (CN); Zhiqiu Guo, Zhejiang (CN); Bo Li, Zhejiang (CN); Chunhua Tao, Zhejiang (CN); Rui Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/469,498

(22) Filed: Sep. 8, 2021

(65) Prior Publication Data

US 2023/0006073 A1 Jan. 5, 2023

(30) Foreign Application Priority Data

Jun. 30, 2021 (CN) .......................... 202110737366.7

(51) Int. Cl.
*H01L 31/02* (2006.01)
*H01L 31/05* (2014.01)
*H02S 40/34* (2014.01)

(52) U.S. Cl.
CPC .... *H01L 31/0201* (2013.01); *H01L 31/02013* (2013.01); *H01L 31/0508* (2013.01); *H02S 40/34* (2014.12)

(58) Field of Classification Search
CPC ........... H01L 31/0201; H01L 31/02013; H01L 31/0508; H02S 40/34
See application file for complete search history.

(56) References Cited

U.S. PATENT DOCUMENTS

2008/0115822 A1* 5/2008 Cunningham ...... H01L 31/0201
136/244
2011/0226305 A1* 9/2011 Chen ..................... H01L 31/042
136/244

FOREIGN PATENT DOCUMENTS

CN 206976374 2/2018
CN 208336245 1/2019
(Continued)

OTHER PUBLICATIONS

English Translation of CN 112 614 908A (Year: 2021).*
(Continued)

*Primary Examiner* — Kourtney R S Carlson
(74) *Attorney, Agent, or Firm* — NIXON PEABODY LLP; Jeffrey L. Costellia

(57) ABSTRACT

Provided is a photovoltaic module, including a first intermediate busbar having a first lead-out terminal provided at an end thereof; a second intermediate busbar having a second lead-out terminal provided at an end thereof; and a first jumper wire arranged on a first isolation bar; the first lead-out terminal and the second lead-out terminal are located on two opposite sides of the first jumper wire, and the first lead-out terminal and the second lead-out terminal abut against two opposite side surfaces of the first isolation bar or overlap a top surface of the first isolation bar. Compared with the related art, the first isolation bar where the first jumper wire is located is clamped or pressed by the first lead-out terminal and the second lead-out terminal, to prevent short circuit or shielding of the cell caused by free movement of the first jumper wire, the first and second intermediate busbars.

18 Claims, 11 Drawing Sheets

(56) References Cited

FOREIGN PATENT DOCUMENTS

| | | |
|---|---|---|
| CN | 210224051 | 3/2020 |
| CN | 210926041 | 7/2020 |
| CN | 211828801 | 10/2020 |
| CN | 112614908 | 4/2021 |
| CN | 112803888 | 5/2021 |
| JP | 2005-244046 | 9/2005 |
| JP | 2019-126250 | 7/2019 |
| JP | 2019-533408 | 11/2019 |
| JP | 2020-509595 | 3/2020 |

OTHER PUBLICATIONS

Japanese Office Action for Application No. 2021-146331, dated Sep. 20, 2020 (6 pages).
Extended European Search Report (Application No. 21195663.6) dated Feb. 22, 2022 (9 pages).
Japanese Office Action for Application No. 2021-146331 dated Nov. 16, 2021.

* cited by examiner

PHOTOVOLTAIC MODULE

CROSS-REFERENCE TO RELATED APPLICATIONS

The present application claims priority to Chinese Patent Application No. 202110737366.7, filed on Jun. 30, 2021, the content of which is incorporated herein by reference in its entirety.

TECHNICAL FIELD

The present disclosure relates to the field of photovoltaic power generation technologies, and in particular, to a photovoltaic module.

BACKGROUND

With the continuous development of the photovoltaic technologies, photovoltaic modules are gradually applied to various fields in social life and are more and more favored by users.

A photovoltaic module in the related art includes an upper solar cell string group and a lower solar cell string group. The upper solar cell string group and the lower solar cell string group are electrically connected through a jumper wire. The jumper wire is generally a conductor formed of a conductive material. When the jumper wire overlaps with a solar cell array, an interconnection strip configured to realize an electrical connection between solar cells may overlap with the jumper wire. If they are in direct contact, an electrical connection is caused, thereby adversely affecting normal operation of the photovoltaic module.

An objective of the present disclosure is to provide a photovoltaic module, so as to solve the technical problems in the related art.

The present disclosure provides a photovoltaic module, and the photovoltaic module includes: a first intermediate busbar having a first lead-out terminal provided at an end of the first intermediate busbar, a second intermediate busbar having a second lead-out terminal provided at an end of the second intermediate busbar, and a first jumper wire arranged on a first isolation bar. The first lead-out terminal and the second lead-out terminal are located on two opposite sides of the first jumper wire, and the first lead-out terminal and the second lead-out terminal abut against two opposite side surfaces of the first isolation bar or overlap a top surface of the first isolation bar.

In an embodiment, the photovoltaic module further includes an upper solar cell unit and a lower solar cell unit connected in parallel. The upper solar cell unit includes a first upper solar cell string group and a second upper solar cell string group. The first upper solar cell string group and the second upper solar cell string group are connected in series through a first upper busbar. The lower solar cell unit includes a first lower solar cell string group and a second lower solar cell string group. The first lower solar cell string group and the second lower solar cell string group are connected in series through a first lower busbar. The first upper solar cell string group, the second upper solar cell string group, the first lower solar cell string group and the second lower solar cell string group each include a plurality of solar cell strings. When the number of the solar cell strings is greater than or equal to 2, the plurality of solar cell strings are connected in parallel. Each of the plurality of solar cell strings includes a plurality of solar cells connected in series. The first intermediate busbar is connected between the first upper solar cell string group and the first lower solar cell string group, and the second intermediate busbar is connected between the second upper solar cell string group and the second lower solar cell string group. The first upper busbar and the first lower busbar are electrically connected through the first jumper wire, the first jumper wire is arranged on the solar cell, and the first isolation bar is arranged between the first jumper wire and the solar cell.

In an embodiment, the first jumper wire is electrically connected to a first L-shaped lead-out wire. One side of the first L-shaped lead-out wire is attached and connected to the first jumper wire, and the other side of the first L-shaped lead-out wire extends toward a direction away from a plane of the solar cell.

In an embodiment, the first jumper wire includes a first sub-portion and a second sub-portion, and the second sub-portion partially overlaps the first sub-portion. An end of the second sub-portion is bent toward a direction away from a plane of the solar cell to form a third lead-out terminal, and a bottom of the third lead-out terminal overlaps the first sub-portion.

In an embodiment, the photovoltaic module further includes a third intermediate busbar and a second jumper wire. An end of the third intermediate busbar is bent toward the direction away from the plane of the solar cell to form a fourth lead-out terminal, and the second jumper wire is electrically connected to the second intermediate busbar.

In an embodiment, the upper solar cell unit further includes a third upper solar cell string group, and the lower solar cell unit further includes a third lower solar cell string group. The third intermediate busbar is connected between the third upper solar cell string group and the third lower solar cell string group. The third upper solar cell string group and the third lower solar cell string group are electrically connected through the second jumper wire.

In an embodiment, the second intermediate busbar is electrically connected to a second L-shaped lead-out wire. One side of the second L-shaped lead-out wire is attached and connected to the second intermediate busbar, and the other side of the second L-shaped lead-out wire extends toward the direction away from the plane of the solar cell. The second jumper wire is arranged across the second intermediate busbar and is located between the second L-shaped lead-out wire and the fourth lead-out terminal.

In an embodiment, an end of the second intermediate busbar is bent toward the direction away from the plane of the solar cell to form a fifth lead-out terminal. The fifth lead-out terminal is located between the second jumper wire and the fourth lead-out terminal, and the second jumper wire is arranged across the second intermediate busbar and is arranged close to the fifth lead-out terminal.

In an embodiment, an end of the second intermediate busbar is bent toward the direction away from the plane of the solar cell to form a sixth lead-out terminal. The second jumper wire is arranged between the sixth lead-out terminal and the fourth lead-out terminal and is arranged close to the sixth lead-out terminal, and the second jumper wire and the sixth lead-out terminal are fixed to a spacer.

In an embodiment, the first intermediate busbar, the second intermediate busbar and the first jumper wire are electrically connected through a double-diode junction box. The double-diode junction box includes a box body, and the box body is provided in an interior with a pad, two electrical connection plates and two diodes. Each of the two diodes is corresponding to one of the two electrical connection plates, one end of the diode is electrically connected to the corresponding electrical connection plate, the other end of the diode is electrically connected to the pad, and the electrical connection plate is arranged across the diode.

REFERENCE SIGNS

100: upper solar cell unit, 101: first upper solar cell string group, 102: second upper solar cell string group, 103: third upper solar cell string group;
200: lower solar cell unit, 201: first lower solar cell string group, 202: second lower solar cell string group, 203: third lower solar cell string group;
301: first upper busbar, 302: first lower busbar, 303: first intermediate busbar, 304: second intermediate busbar, 305: third intermediate busbar;
401: first lead-out terminal, 402: second lead-out terminal, 403: third lead-out terminal, 404: fourth lead-out terminal, 405: fifth lead-out terminal, 406: sixth lead-out terminal;
501: first jumper wire, 5011: first sub-portion, 5022: second sub-portion, 502: second jumper wire;
601: first L-shaped lead-out wire, 602: second L-shaped lead-out wire;
701: first isolation bar; 702: second isolation bar;
800: spacer;
900: double-diode junction box, 901: box body, 902: electrical connection plate, 903: pad, 904: diode, 905: first hole, 906: second hole, 907: third hole.

DESCRIPTION OF EMBODIMENTS

Embodiments described below with reference to the accompanying drawings are intended only to explain the present disclosure and cannot be interpreted as limitations on the present disclosure.

Embodiment 1

Figure 1:
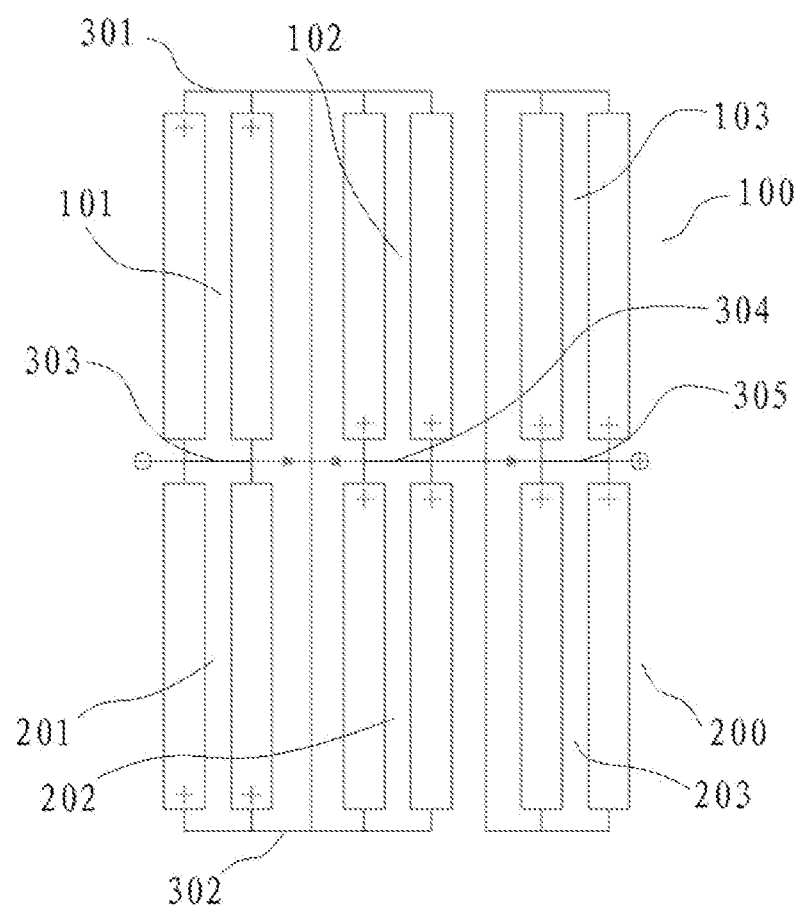
FIG. 1 is a circuit layout according to the present disclosure.
Figure 2:
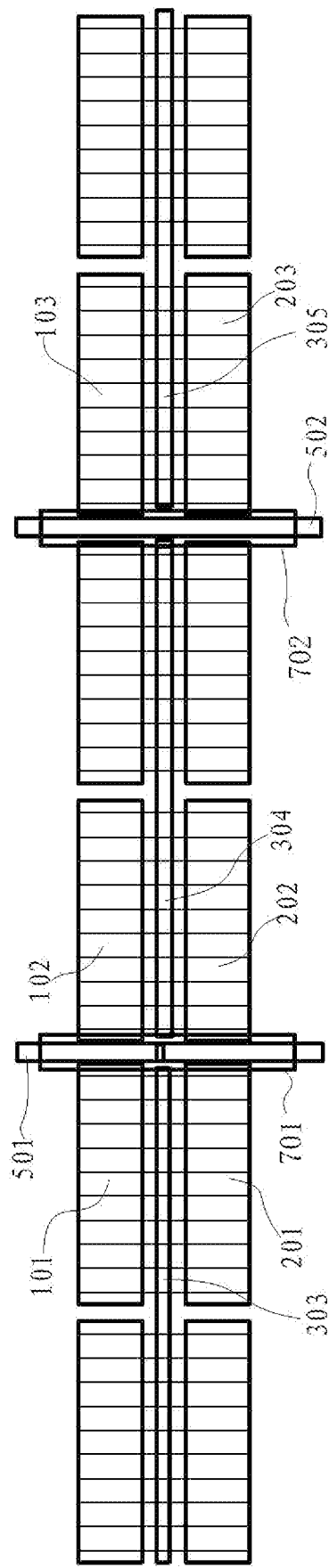
FIG. 2 is a rear view of internal connections of a middle position according to Embodiment 1 of the present disclosure.
Figure 3:
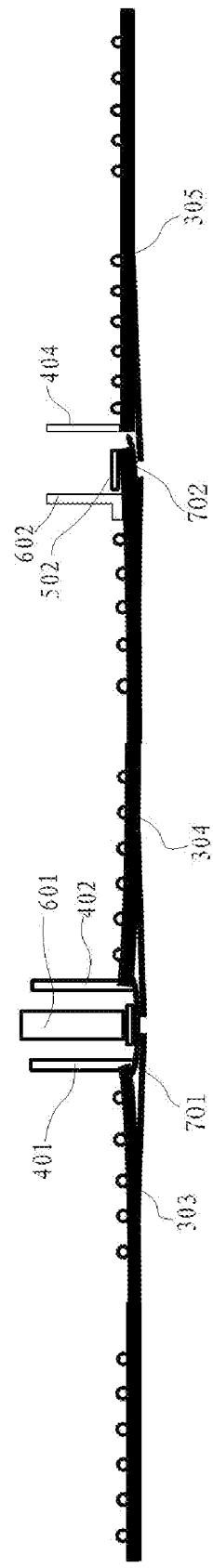
FIG. 3 is a cross-sectional view of the middle position according to Embodiment 1 of the present disclosure.
Figure 4:
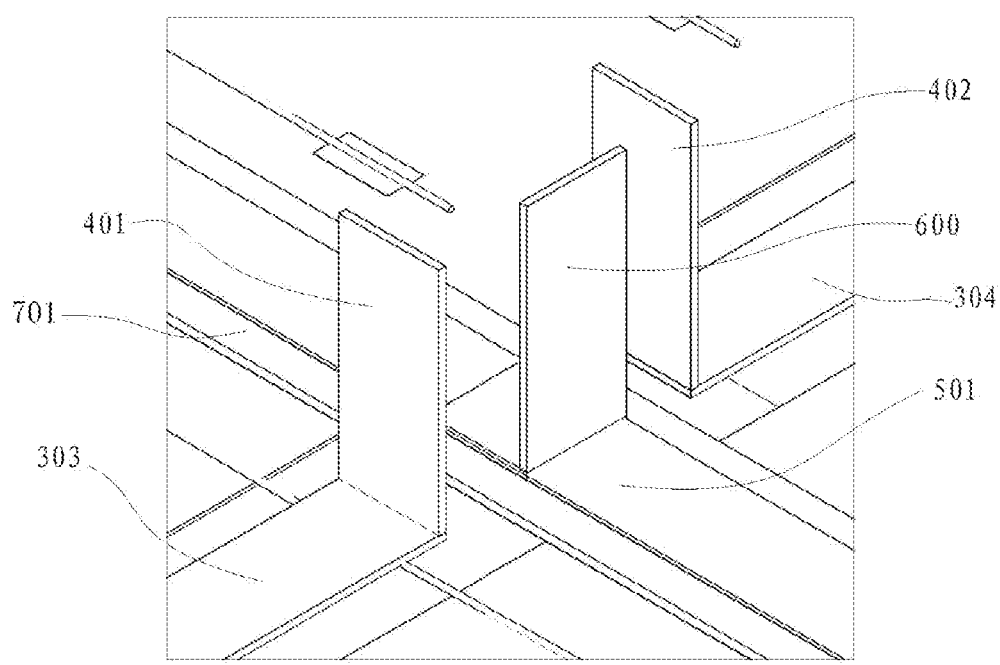
FIG. 4 is a first partial isometric view according to Embodiment 1 of the present disclosure.
Figure 5:
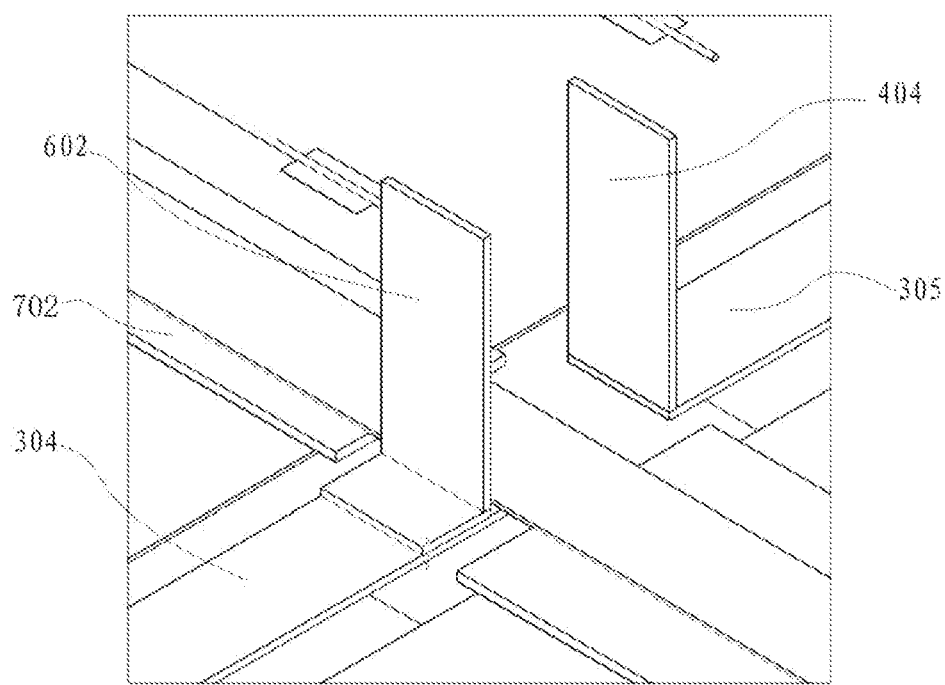
FIG. 5 is a second partial isometric view according to Embodiment 1 of the present disclosure.
Figure 6:
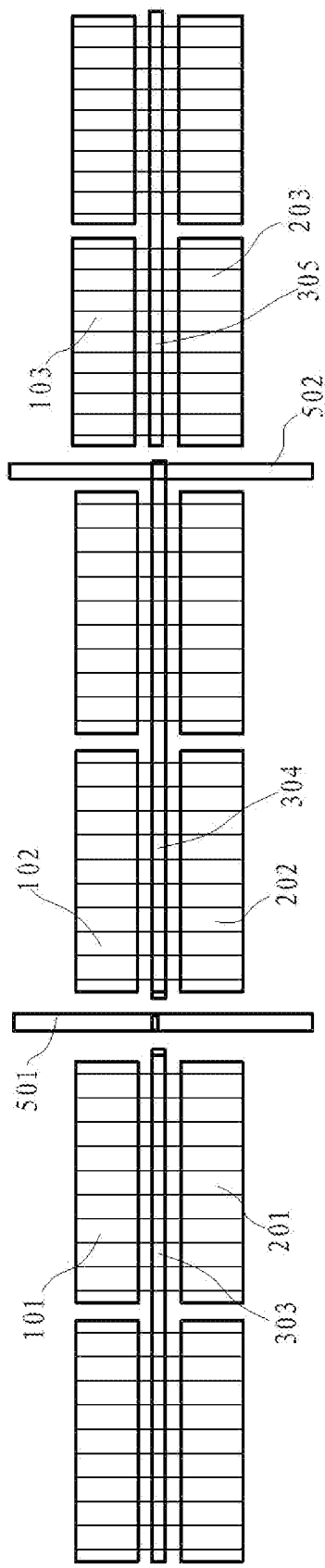
FIG. 6 is a rear view of internal connections of a middle position according to Embodiment 2 of the present disclosure.
Figure 7:
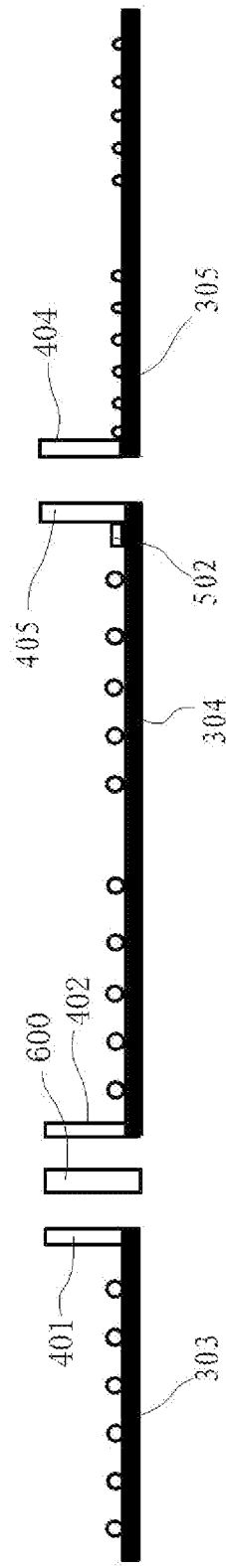
FIG. 7 is a cross-sectional view of the middle position according to Embodiment 2 of the present disclosure.
Figure 8:
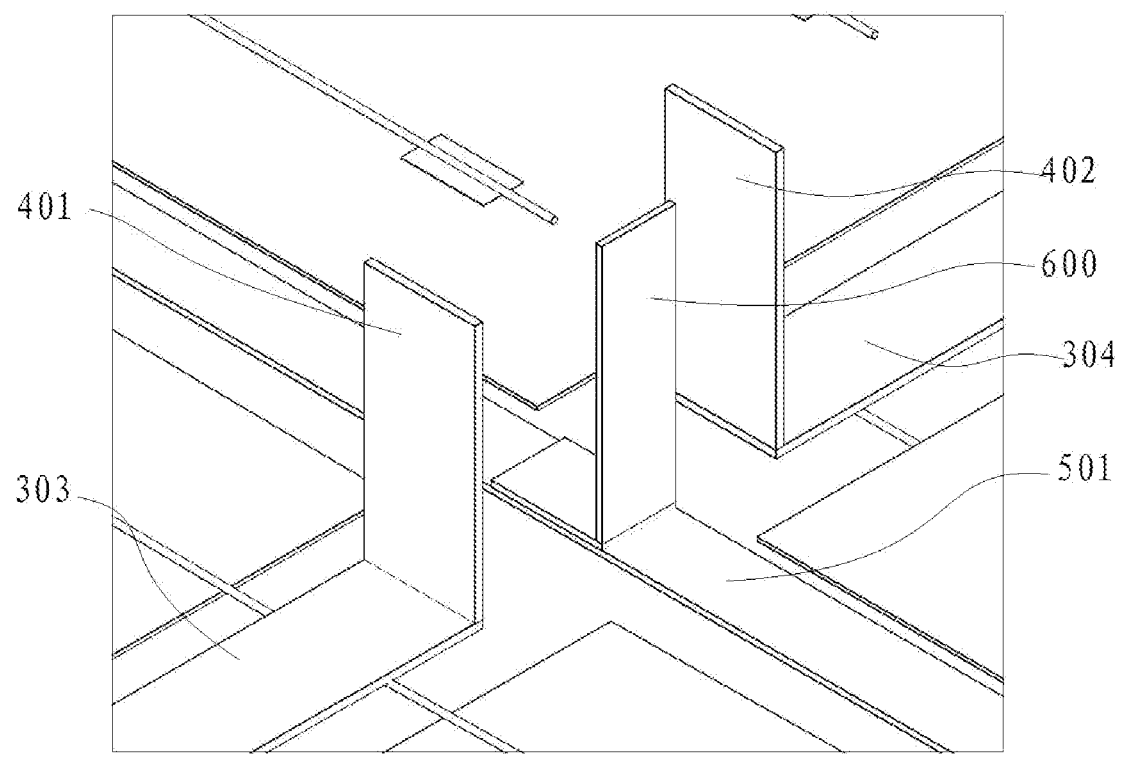
FIG. 8 is a first partial isometric view according to Embodiment 2 of the present disclosure.
Figure 9:
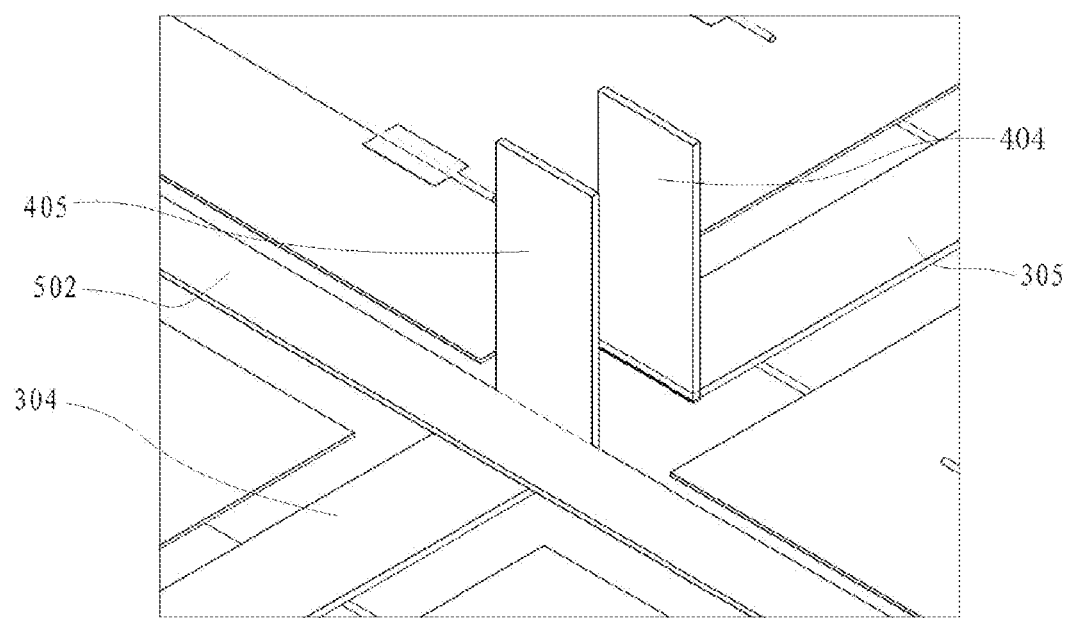
FIG. 9 is a second partial isometric view according to Embodiment 2 of the present disclosure.
Figure 10:
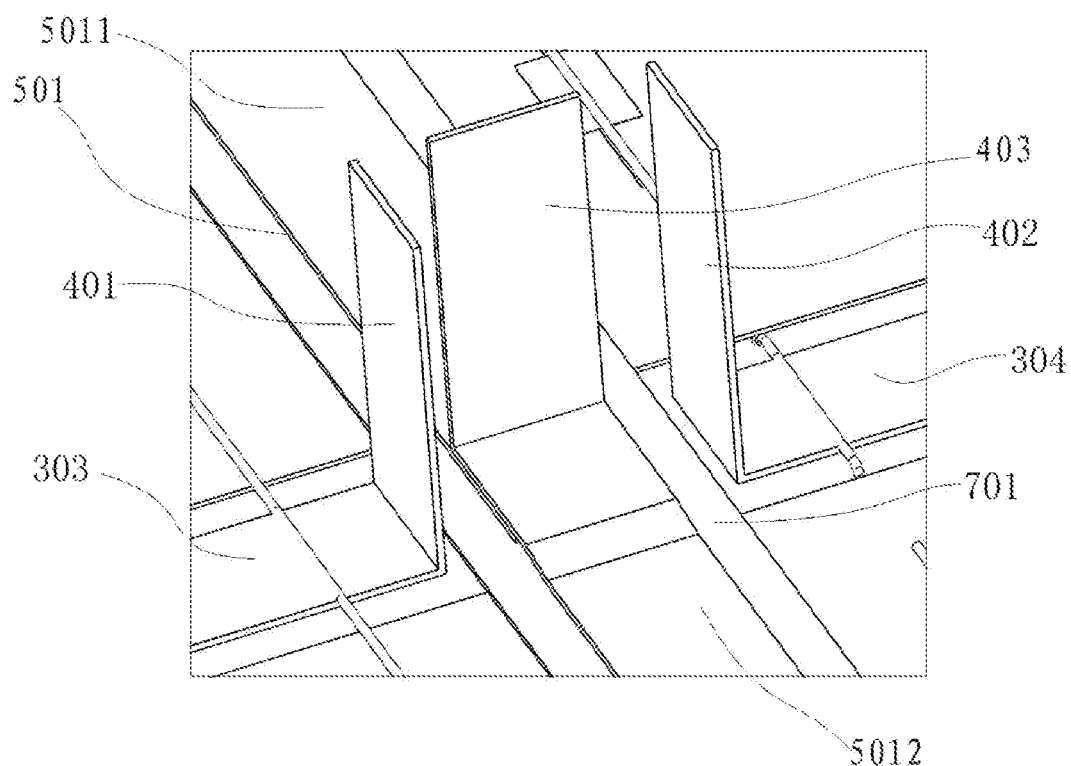
FIG. 10 is a first partial isometric view according to Embodiment 3 of the present disclosure.
Figure 11:
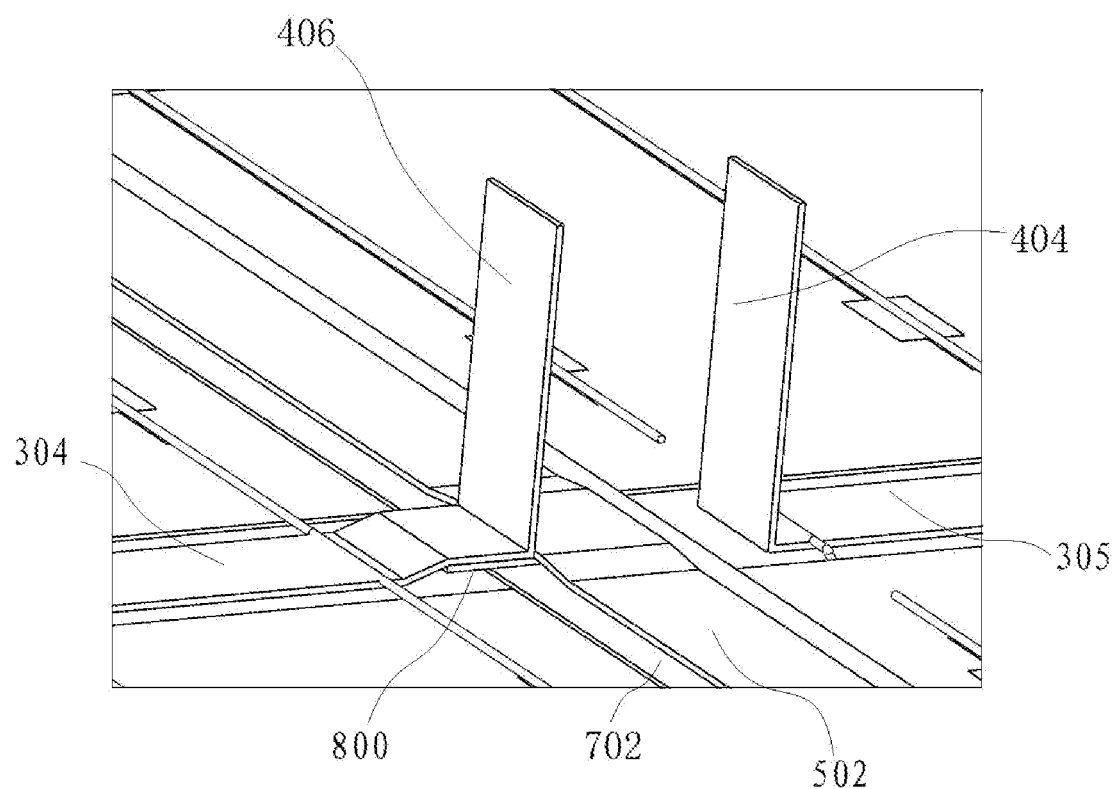
FIG. 11 is a second partial isometric view according to Embodiment 3 of the present disclosure.
Figure 12:
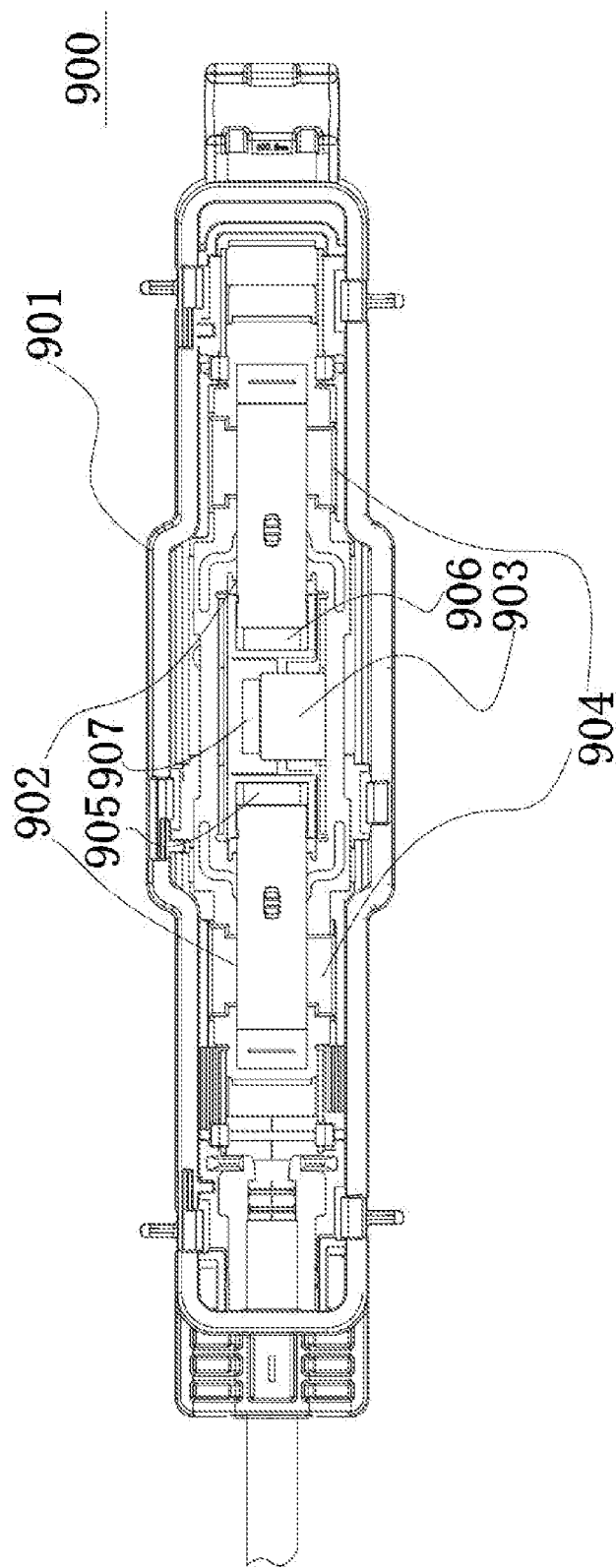
FIG. 12 is a top view of a double-diode junction box according to the present disclosure.
Figure 13:
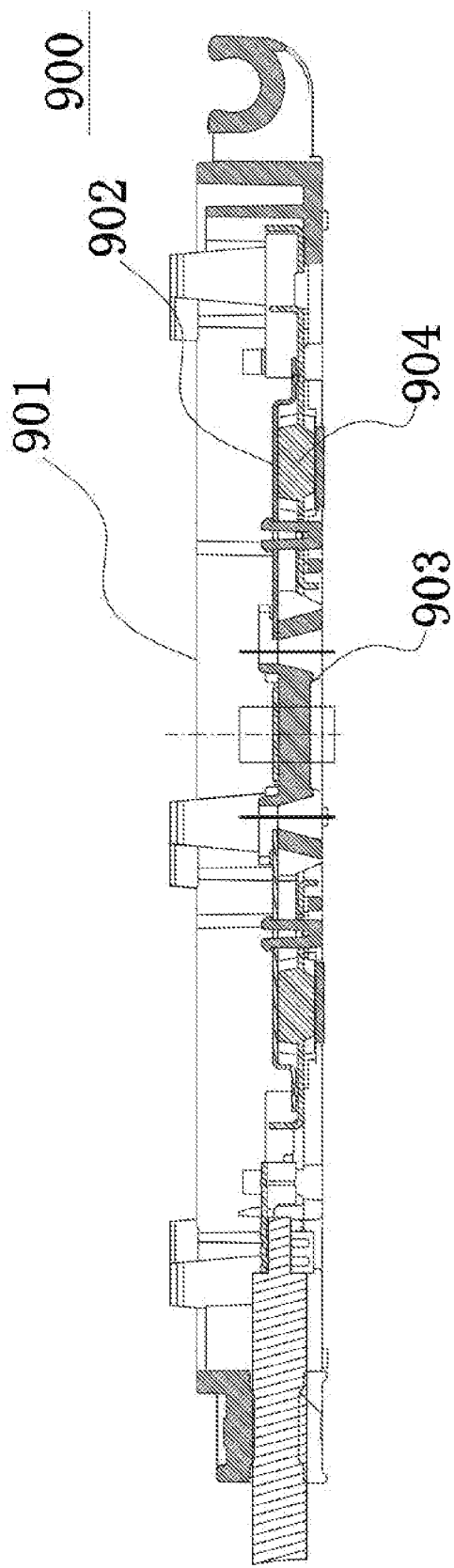
FIG. 13 is a sectional view of a double-diode junction box according to the present disclosure.

As shown in FIG. 1, an embodiment of the present disclosure provides a photovoltaic module, including: an upper solar cell unit 100 and a lower solar cell unit 200 connected in parallel.

The upper solar cell unit 100 includes a first upper solar cell string group 101 and a second upper solar cell string group 102, adjacent solar cell strings of the first upper solar cell string group 101 and the second upper solar cell string group 102 have opposite polarity, and the first upper solar cell string group 101 and the second upper solar cell string group 102 are connected in series through a first upper busbar 301. The lower solar cell unit 200 includes a first lower solar cell string group 201 and a second lower solar cell string group 202, adjacent solar cell strings of the first lower solar cell string group 201 and the second lower solar cell string group 202 have opposite polarity, and the first lower solar cell string group 201 and the second lower solar cell string group 202 are connected in series through a first lower busbar 302. The first upper solar cell string group 101, the second upper solar cell string group 102, the first lower solar cell string group 201 and the second lower solar cell string group 202 each include a plurality of solar cell strings, and when the number of the solar cell strings is greater than or equal to 2, the solar cell strings are connected in parallel. The solar cell string includes a plurality of solar cells connected in series.

In this embodiment, an existing solar cell of a conventional size (156 mm to 210 mm) is cut by laser into four independent solar cells of a same size. Each solar cell has a positive electrode and a back electrode, and positions of each positive electrode and each back electrode position coincide with each other. The cut small solar cells are connected in series by an interconnection strip to form a solar cell string. In this embodiment, the first upper solar cell string group 101, the second upper solar cell string group 102, the first lower solar cell string group 201 and the second lower solar cell string group 202 each include two parallel solar cell strings.

A first intermediate busbar 303 is connected between the first upper solar cell string group 101 and the first lower solar cell string group 201. The first upper solar cell string group 101 and the first lower solar cell string group 201 are connected in parallel through the first intermediate busbar 303, and the solar cells at the connecting point have same polarity. An end of the first intermediate busbar 303 is provided with a first lead-out terminal 401.

A second intermediate busbar 304 is connected between the second upper solar cell string group 102 and the second lower solar cell string group 202. The second upper solar cell string group 102 and the second lower solar cell string group 202 are connected in parallel through the second intermediate busbar 304, and the solar cells at the connecting point have same polarity. An end of the second intermediate busbar 304 is provided with a second lead-out terminal 402.

With the introduction of parallel circuits, the number of parallel solar cell strings is increased, a serial resistance loss can be reduced by 15 W, and power of the module is expected to be increased by at least 3 levels. At the same time, the number of parallel circuits is increased, and the overall serial resistance of the module is also reduce, thereby reducing the power loss.

It is to be noted that, middle positions where the first intermediate busbar 303 and the second intermediate busbar 304 are located do not need to be exact middle, which may also include regions near the middle portion.

The first upper busbar 301 and the first lower busbar 302 are electrically connected through the first jumper wire 501, the first jumper wire 501 may be arranged on the solar cell, and a first isolation bar 701 is arranged between the first jumper wire 501 and the solar cell. Insulation and isolation are achieved through the first isolation bar 701. At the same time, a width of the photovoltaic module can be reduced, thereby reducing auxiliary materials consumption such as in the back plate and the adhesive film and reducing material costs.

The first jumper wire 501 solves the problem that a diode in a single junction box in bypass bridging is subjected to an excessive high voltage and causes a breakdown risk, the first jumper wire 501 does not transmit current when the module is in a normal operation, and is configured to transmit a current only when a hot spot appears in the module and the diode in the junction box is operating.

The first isolation bar 701 preferably has a multilayer structure in which an intermediate layer is an insulation material and upper and lower layers are materials with certain adhesion properties, and bonded to a metal strip through the adhesive materials in the upper and lower layers. Such an adhesive material may be pressure sensitive or thermal sensitive. Upper and lower bonding layers have a thickness of no less than 0.1 mm, which ensures bonding performance. The first isolation bar 701 has an overall thickness between 0.32 mm and 0.5 mm, which prevents crushing of the solar cell due to an excessive thickness.

In this embodiment, the first jumper wire 501 adopts a wide and thin metal strip with a thickness of no more than 0.3 mm, such as 3*0.2 mm, 3*0.25 mm, 4*0.2 mm, 4*0.25 min, 5*0.2 mm, 5*0.15 mm, 6*0.2 mm or 6*0.15 mm. The metal strip has certain transverse strength due to an increase in the width during stack-welding and is not easy to be bent. The deviation problem during actual manufacturing is solved, and the difficulty of the manufacturing process is reduced. The thinner size also avoids the problems of extrusion of the solar cell and bubble formation during lamination.

The first jumper wire 501 and the first isolation bar 701 are positioned by a fixed tape or pre-welding. A distance between an edge of the first isolation bar 701 and an edge of the first jumper wire 501 is no less than 2 mm to prevent contact of the first jumper wire 501 with the solar cell caused by deviation.

The first lead-out terminal 401 and the second lead-out terminal 402 may be formed by folding the first intermediate busbar 303 and the second intermediate busbar 304. The first lead-out terminal 401 and the second lead-out terminal 402 are located on two opposite sides of the first jumper wire 501. A distance between bending points of the first lead-out terminal 401 and the second lead-out terminal 402 and the edge of the first jumper wire 501 is limited to 3 mm to 5 mm, which prevents short circuit caused by overlapping. The bending points of the first lead-out terminal 401 and the second lead-out terminal 402 are close to each other, which helps reduce a design length of the junction box. The first lead-out terminal 401 and the second lead-out terminal 402 abut against two opposite side surfaces of the first isolation bar 701 or are lapped over a top surface of the first isolation bar 701. Short circuit or shielding of a cell surface caused by free movement of the first isolation bar 701, the first intermediate busbar 303 and the second intermediate busbar 304 can be prevented.

Furthermore, the first isolation bar 701 is set to be double-sided adhesive to effectively fix the bending points of the first lead-out terminal 401 and the second lead-out terminal 402 and to prevent short circuit of the diode caused by the deviation. In addition, the first isolation bar 701 is double-sided adhesive, which limits its adjacent solar cell strings and prevents overlapping caused by an excessive close string pitch between the solar cell strings.

Furthermore, the upper solar cell unit 100 further includes a third upper solar cell string group 103. Adjacent solar cell strings of the third upper solar cell string group 103 and the second upper solar cell string group 102 have same polarity. The lower solar cell unit 200 further includes a third lower solar cell string group 203. Adjacent solar cell strings of the third lower solar cell string group 203 and the second lower solar cell string group 202 have same polarity. A third intermediate busbar 305 is connected between the third upper solar cell string group 103 and the third lower solar cell string group 203. The third upper solar cell string group 103 and the third lower solar cell string group 203 are connected in parallel through the third intermediate busbar 305, and the solar cells at the connecting point have same polarity.

The third upper solar cell string group 103 and the third lower solar cell string group 203 are electrically connected through a second jumper wire 502. The second jumper wire 502 is electrically connected to the second intermediate busbar 304. A second isolation bar 702 is provided between the second jumper wire and the solar cell. The structure and function of the second isolation bar 702 may be obtained with reference to the structure and function of the first isolation bar 701. The second intermediate busbar 304 and the third intermediate busbar 305 are electrically connected to a diode. The second jumper wire 502 is configured to transmit a current when the photovoltaic module is in a normal operation state. At the same time, a width of the photovoltaic module can be reduced, thereby reducing auxiliary materials consumption such as in the back plate and the adhesive film and reducing material costs.

In this embodiment, the second jumper wire 502 adopts a wide and thin metal strip with a thickness of no more than 0.3 mm, such as 3*0.2 mm, 3*0.25 mm, 4*0.2 mm, 4*0.25 mm, 5*0.2 mm, 5*0.15 mm, 6*0.2 mm or 6*0.15 mm. The metal strip has certain transverse strength due to an increase in the width during stack-welding and is not easy to be bent. The deviation problem during actual manufacturing is solved, and the difficulty of the manufacturing process is reduced. The thinner size also avoids the problems of extrusion of the solar cell and bubble formation during lamination.

In this embodiment, the first jumper wire 501 is electrically connected to a first L-shaped lead-out wire 601, one side of the first L-shaped lead-out wire 601 is attached and connected to the first jumper wire 501, and the other side of the first L-shaped lead-out wire 601 extends toward a direction away from a plane of the solar cell, which may be perpendicular to the plane of the solar cell, and may also maintain a set angle. Keeping a vertical orientation applies to electric resistance welding, and re-bending applies to tin soldering.

The first L-shaped lead-out wire 601 is a dielectric through which the first jumper wire 501 is electrically connected to a diode in a double-diode junction box 900. Such a setting process is simple and easy to implement, and can reduce the number of connection lines, which help to simplify the structure of the photovoltaic module and the connection process. The first L-shaped lead-out wire 601, the first lead-out terminal 401 and the second lead-out terminal 402 may extend perpendicular to a plane of the solar cell. They may also obliquely extend relative to the plane of the solar cell. That is, an angle between the first L-shaped lead-out wire 601, the first lead-out terminal 401, the second lead-out terminal 402 and the plane of the solar cell may not be 90°, as long as the first L-shaped lead-out wire 601, the first lead-out terminal 401 and the second lead-out terminal 402 are parallel to one another.

The first L-shaped lead-out wire 601, the first lead-out terminal 401 and the second lead-out terminal 402 are electrically connected through a double-diode junction box 900. The double-diode junction box 900 includes a box body 901. The box body 901 is provided in its interior with a pad 903, an electrical connection plate 902 and a diode 904. Two electrical connection plates 902 and two diodes 904 are provided. Each of the diodes 904 is provided with one of the electrical connection plates 902, one end of the diode 904 is electrically connected to the corresponding electrical connection plate 902, and the other end of the diode 904 is electrically connected to the pad 903. The electrical connection plate 902 is arranged across the diode 904.

A first hole 905 is formed on one of the electrical connection plates 902. The first hole 905 is configured to allow the first lead-out terminal 401 to pass through to be electrically connected to the corresponding electrical connection plate 902. A second hole 906 is formed on the other of the electrical connection plates 902. The second hole 906 is configured to allow the second lead-out terminal 402 to pass through to be electrically connected to the corresponding electrical connection plate 902. A third hole 907 is formed on the pad 903. The third hole 907 is configured to allow the first L-shaped lead-out wire 601 to pass through to be electrically connected to the pad 903.

Each upper solar cell string group and each lower solar cell string group is connected to a diode, which enables the solar cell string to realize a bypass function when being shielded, thereby preventing damages to the module due to overheating. Moreover, two diodes 904 are arranged in the box body 901 of the double-diode junction box 900, so as to effectively solve the technical problem of a complex manufacturing process of lead-out wires of the photovoltaic module (prevent the arrangement of jumper wires inside the photovoltaic module) and prevent the problem of reliability of the module caused by the arrangement of jumper wires.

The electrical connection plates 902 are arranged across the corresponding diodes 904, respectively, which, on the one hand, ensures a narrower width of the box body 901 of the junction box, so as to reduce the shielding of the photovoltaic module and improve the power generation efficiency and, on the other hand, enables the electrical connection plate 902 to be attached to an outer sealing case of the diode 904 and increases a contact area, thereby facilitating heat dissipation of the diode.

Further, the second intermediate busbar 304 is electrically connected to a second L-shaped lead-out wire 602, a horizontal section of the second L-shaped lead-out wire 602 is attached and connected to the second intermediate busbar 304, and a vertical section of the second L-shaped lead-out wire 602 is perpendicular to the plane of the solar cell. An end of the third intermediate busbar 305 is bent toward the direction away from the plane of the solar cell to form a fourth lead-out terminal 404. The second L-shaped lead-out wire 602 and the fourth lead-out terminal 404 are electrically connected through a single-diode junction box. The structure of the single-diode junction box may be obtained with reference to the structure of the junction box in the related art, which is not described in detail herein.

The second L-shaped lead-out wire 602 is a dielectric through which the second jumper wire 502 is electrically connected to a diode in the single-diode junction box. Such a setting process is simple and easy to implement, and can reduce the number of connection lines, which helps simplify the structure of the photovoltaic module and the connection process. The second L-shaped lead-out wire 602 and the fourth lead-out terminal 404 may extend perpendicular to a plane of the solar cell. They may also obliquely extend relative to the plane of the solar cell. That is, an angle between the second L-shaped lead-out wire 602, the fourth lead-out terminal 404 and the plane of the solar cell may not be 90°, provided that the second L-shaped lead-out wire 602 and the fourth lead-out terminal 404 are ensured to be parallel to each other.

The second jumper wire 502 is arranged across the second intermediate busbar 304 and is located between the second L-shaped lead-out wire 602 and the fourth lead-out terminal 404. The second jumper wire 502 is directly welded to the second intermediate busbar 304 for electrical connection. The arrangement of the second L-shaped lead-out wire 602 can prevent a short-circuited connection caused by an excessive close distance between two lead-out terminals. The second isolation bar 702 may also be arranged in sections to prevent bubbles and hidden micro-cracks of the solar cell during lamination caused by an excessive thickness of the lead-out terminal. The second L-shaped lead-out wire 602 and the fourth lead-out terminal 404 are electrically connected through a single-diode junction box.

In the present disclosure, by using the first lead-out terminal of the first intermediate busbar and the second lead-out terminal of the second intermediate busbar, the first isolation bar where the first jumper wire is located is clamped or pressed at bending points of the first lead-out terminal and the second lead-out terminal, so as to prevent short circuit or shielding of a cell surface caused by free movement of the first jumper wire, the first intermediate busbar and the second intermediate busbar.

Embodiment 2

In this embodiment, the first jumper wire 501 and the second jumper wire 502 are both arranged between solar cell strings. A pitch between two solar cell strings is too large, and thus there is no need to add an isolation bar. The arrangement of the first intermediate busbar 303, the second intermediate busbar 304 and the first jumper wire 501 is the same as that in Embodiment 1, but the difference lies in the arrangement of the second jumper wire 502, the second intermediate busbar 304 and the third intermediate busbar 305.

In an embodiment, an end of the second intermediate busbar 304 is bent toward the direction away from the plane of the solar cell to form a fifth lead-out terminal 405, the fifth lead-out terminal 405 is located between the second jumper wire 502 and the fourth lead-out terminal 404, and the second jumper wire 502 is arranged across the second intermediate busbar 304 and is arranged close to the fifth lead-out terminal 405. Therefore, the second intermediate busbar 304 is effectively fixed, to prevent short circuit or shielding of a cell surface caused by its deviation.

Embodiment 3

In this embodiment, the first jumper wire 501 includes a first sub-portion 5011 and a second sub-portion 5022, the second sub-portion 5022 partially overlaps with the first sub-portion 5011, an end of the second sub-portion 5022 is bent toward a direction away from a plane of the solar cell to form a third lead-out terminal 403, and a bottom of the third lead-out terminal 403 overlaps the first sub-portion 5011. In this embodiment, the first sub-portion 5011 and the second sub-portion 5022 may be of an integral structure to facilitate the manufacturing. The first sub-portion 5011 may also be of a separate structure, which can be achieved by pre-welding. An area of an overlapping portion of the two metal strips is no less than 4×4 mm. The first jumper wire 501 is provided with two sub-portions, and the arrangement of the first L-shaped lead-out wire 601 may be canceled, which makes the welding of the machine easier.

An end of the second intermediate busbar 304 is bent toward the direction away from the plane of the solar cell to form a sixth lead-out terminal 406, the second jumper wire 502 is arranged between the sixth lead-out terminal 406 and the fourth lead-out terminal 404 and is close to the sixth lead-out terminal 406, and the second jumper wire 502 and the sixth lead-out terminal 406 are adhered and fixed to a spacer 800. The spacer 800 is arranged on the plane of the solar cell. The spacer 800 is set to be double-sided adhesive to effectively fix the bending point of the sixth lead-out terminal 406 and the position of the second jumper wire 502 and to prevent deviation, which prevents short circuit of the diode caused by the deviation. The arrangement of the spacer 800 plays a role of connecting the second jumper 502 and the second intermediate busbar 304. In this way, the arrangement of the second L-shaped lead-out wire 602 may be canceled, which makes the welding of the machine easier. According to the above embodiment, a bending point of the first intermediate busbar 303, the second intermediate busbar 304 or the third intermediate busbar 305 is no less than 2 mm away from the nearest main grid weld wire of the cell. This prevents impossible welding of the main grid weld wire of the cell by a welding head due to space limitations.

The present disclosure further provides a wiring method for a photovoltaic module, including the following steps.

A main circuit of the photovoltaic module is formed. The main circuit includes at least one solar cell unit group. The solar cell unit group includes an upper solar cell unit 100 and a lower solar cell unit 200 connected in parallel.

The upper solar cell unit 100 includes a first upper solar cell string group 101, a second upper solar cell string group 102 and a third upper solar cell string group 103. The first upper solar cell string group 101 and the second upper solar cell string group 102 are connected in series through a first upper busbar 301.

The lower solar cell unit 200 includes a first lower solar cell string group 201, a second lower solar cell string group 202 and a third lower solar cell string group 203. The first lower solar cell string group 201 and the second lower solar cell string group 202 are connected in series through a first lower busbar 302.

The first upper solar cell string group 101, the second upper solar cell string group 102, the third upper solar cell string group 103, the first lower solar cell string group 201, the second lower solar cell string group 202 and the third lower solar cell string group 203 each include a plurality of solar cell strings. When the number of the solar cell strings is greater than or equal to 2, the solar cell strings are connected in parallel.

The solar cell string includes a plurality of solar cells connected in series.

A first intermediate busbar 303 is connected between the first upper solar cell string group 101 and the first lower solar cell string group 201. An end of the first intermediate busbar 303 is provided with a first lead-out terminal 401.

A second intermediate busbar 304 is connected between the second upper solar cell string group 102 and the second lower solar cell string group 202. An end of the second intermediate busbar 304 is provided with a second lead-out terminal 402.

A third intermediate busbar 305 is connected between the third upper solar cell string group 103 and the third lower solar cell string group 203.

The first upper busbar 301 and the first lower busbar 302 are electrically connected through a first jumper wire 501, the first jumper wire 501 is arranged on the solar cell, and a first isolation bar 701 is arranged between the first jumper wire 501 and the solar cell.

The third upper solar cell string group 103 and the third lower solar cell string group 203 are electrically connected through a second jumper wire 502.

The first lead-out terminal 401 and the second lead-out terminal 402 are located on two opposite sides of the first jumper wire 501, and the first lead-out terminal 401 and the second lead-out terminal 402 abut against two opposite side surfaces of the first isolation bar 701 or overlap a top surface of the first isolation bar 701.

The structure, features and effects of the present disclosure are described in detail above according to the embodiments shown in the drawings. The above are only preferred embodiments of the present disclosure, but the present disclosure does not limit the scope of implementation as illustrated in the drawings. Any changes made in accordance with the conception of the present disclosure, or equivalent embodiments modified as equivalent changes, which still do not exceed the spirit covered by the specification and the drawings, shall fall within the protection scope of the present disclosure.

What is claimed is:

1. A photovoltaic module, comprising:
    a first intermediate busbar having a first lead-out terminal folded at an end of the first intermediate busbar, the first intermediate busbar extending along a first direction;
    a second intermediate busbar having a second lead-out terminal folded at an end of the second intermediate busbar, the second intermediate busbar extending along the first direction;
    a first isolation bar being a double-sided adhesive for adhering the first lead-out terminal and/or the second lead-out terminal; and
    a first jumper wire arranged on the first isolation bar, the first jumper wire and the first isolation bar extending along a second direction perpendicular to the first direction, wherein the first lead-out terminal and the second lead-out terminal are located on two opposite sides of the first jumper wire, and the first lead-out terminal and the second lead-out terminal abut against two opposite side surfaces of the first isolation bar, or
    the first lead-out terminal and the second lead-out terminal overlap and in direct contact with a top surface of the first isolation bar, and
    along a direction perpendicular to a plane of the photovoltaic module, a projection of the first lead-out terminal and a projection of the second lead-out terminal overlap the first isolation bar.

2. The photovoltaic module according to claim 1, further comprising an upper solar cell unit and a lower solar cell unit connected in parallel, wherein
    the upper solar cell unit comprises a first upper solar cell string group and a second upper solar cell string group, and the first upper solar cell string group and the second upper solar cell string group are connected in series through a first upper busbar;

the lower solar cell unit comprises a first lower solar cell string group and a second lower solar cell string group, and the first lower solar cell string group and the second lower solar cell string group are connected in series through a first lower busbar;

the first upper solar cell string group, the second upper solar cell string group, the first lower solar cell string group and the second lower solar cell string group each comprise a plurality of solar cell strings, and when a quantity of the solar cell strings is greater than or equal to 2, the plurality of solar cell strings are connected in parallel;

each of the plurality of solar cell strings comprises a plurality of solar cells connected in series;

the first intermediate busbar is connected between the first upper solar cell string group and the first lower solar cell string group;

the second intermediate busbar is connected between the second upper solar cell string group and the second lower solar cell string group; and the first upper busbar and the first lower busbar are electrically connected through the first jumper wire, the first jumper wire is connected to at least one solar cell of the first upper solar cell string group and at least one solar cell of the first lower solar cell string group through the first isolation bar.

3. The photovoltaic module according to claim 2, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

4. The photovoltaic module according to claim 1, wherein the first jumper wire is electrically connected to a first L-shaped lead-out wire, one side of the first L-shaped lead-out wire is attached and connected to the first jumper wire, and the other side of the first L-shaped lead-out wire extends toward a direction away from a plane of the solar cell.

5. The photovoltaic module according to claim 4, further comprising a third intermediate busbar and a second jumper wire, wherein an end of the third intermediate busbar is bent toward the direction away from the plane of the solar cell to form a fourth lead-out terminal, and the second jumper wire is electrically connected to the second intermediate busbar.

6. The photovoltaic module according to claim 5, wherein the upper solar cell unit further comprises a third upper solar cell string group, the lower solar cell unit further comprises a third lower solar cell string group, and the third intermediate busbar is connected between the third upper solar cell string group and the third lower solar cell string group; and the third upper solar cell string group and the third lower solar cell string group are electrically connected through the second jumper wire.

7. The photovoltaic module according to claim 6, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

8. The photovoltaic module according to claim 5, wherein the second intermediate busbar is electrically connected to a second L-shaped lead-out wire, one side of the second L-shaped lead-out wire is attached and connected to the second intermediate busbar, and the other side of the second L-shaped lead-out wire extends toward the direction away from the plane of the solar cell; and the second jumper wire is arranged across the second intermediate busbar and is located between the second L-shaped lead-out wire and the fourth lead-out terminal.

9. The photovoltaic module according to claim 8, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

10. The photovoltaic module according to claim 5, wherein an end of the second intermediate busbar is bent toward the direction away from the plane of the solar cell to form a fifth lead-out terminal, the fifth lead-out terminal is located between the second jumper wire and the fourth lead-out terminal, and the second jumper wire is arranged across the second intermediate busbar and is arranged close to the fifth lead-out terminal.

11. The photovoltaic module according to claim 10, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

12. The photovoltaic module according to claim 5, wherein an end of the second intermediate busbar is bent toward the direction away from the plane of the solar cell to form a sixth lead-out terminal, the second jumper wire is arranged between the sixth lead-out terminal and the fourth lead-out terminal and is arranged close to the sixth lead-out terminal, and the second jumper wire and the sixth lead-out terminal are fixed to a spacer.

13. The photovoltaic module according to claim 12, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

14. The photovoltaic module according to claim 5, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

15. The photovoltaic module according to claim 4, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

16. The photovoltaic module according to claim 1, wherein the first jumper wire comprises a first sub-portion and a second sub-portion, the second sub-portion partially overlaps the first sub-portion, an end of the second sub-portion is bent toward a direction away from a plane of the solar cell to form a third lead-out terminal, and a bottom of the third lead-out terminal overlaps the first sub-portion.

17. The photovoltaic module according to claim 16, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

18. The photovoltaic module according to claim 1, wherein the first intermediate busbar, the second intermediate busbar and the first jumper wire are electrically connected through a double-diode junction box, the double-diode junction box comprises a box body, the box body is provided in an interior with a pad, two electrical connection plates and two diodes, each of the two diodes is corresponding to one of the two electrical connection plates, one end of the diode is electrically connected to the corresponding electrical connection plate, the other end of the diode is electrically connected to the pad, and the electrical connection plate is arranged across the diode.

* * * * *